(12) United States Patent
Humfeld et al.

(10) Patent No.: US 9,958,145 B2
(45) Date of Patent: May 1, 2018

(54) LIGHTING DEVICE AND SYSTEM AND METHOD FOR MAKING AND USING THE SAME

(71) Applicant: The Boeing Company, Chicago, IL (US)

(72) Inventors: Keith D. Humfeld, Tukwila, WA (US); Morteza Safai, Newcastle, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days. days.

(21) Appl. No.: 15/220,194

(22) Filed: Jul. 26, 2016

(65) Prior Publication Data
US 2018/0031220 A1    Feb. 1, 2018

(51) Int. Cl.
| H01L 31/00 | (2006.01) |
| H01L 31/04 | (2014.01) |
| F21V 23/02 | (2006.01) |
| H01L 25/16 | (2006.01) |
| F21V 21/08 | (2006.01) |
| B60Q 3/02 | (2006.01) |
| F21Y 115/10 | (2016.01) |

(52) U.S. Cl.
CPC ............ *F21V 23/02* (2013.01); *B60Q 3/0253* (2013.01); *B60Q 3/0259* (2013.01); *F21V 21/0808* (2013.01); *H01L 25/167* (2013.01); *F21Y 2115/10* (2016.08)

(58) Field of Classification Search
None
See application file for complete search history.

(56) References Cited

U.S. PATENT DOCUMENTS

| 2007/0267625 | A1* | 11/2007 | Wang ...................... B82Y 10/00 257/14 |
| 2007/0295395 | A1* | 12/2007 | Phillips .................. B82Y 10/00 136/255 |
| 2009/0059609 | A1* | 3/2009 | Marshall .................. F21K 9/00 362/470 |
| 2012/0186635 | A1* | 7/2012 | Eastman ................ B82Y 30/00 136/252 |

(Continued)

OTHER PUBLICATIONS

Zhengzheng Zhang; "Planar Light Source Using a Phosphor Screen With Highly Crystalline Single-Walled Carbon Nanotubes (SWCNTs) As Field Emitters Demonstrates Its Potential for Energy-Efficient Lighting Device"; Review of Scientific Instruments; publishing.aip.org/publishing/journal-highlights/beyond-leds-flat-panel-lights-using-carbon-nanotubes; Oct. 14, 2014; 3 pgs.

(Continued)

*Primary Examiner* — Khaja Ahmad
(74) *Attorney, Agent, or Firm* — MH2 Technology Law Group LLP

(57) ABSTRACT

A lighting device includes a light-emitting diode (LED). A first carbon nanotube (CNT) is coupled to and extends from the LED. A second CNT is coupled to and extends from the LED. The first and second CNTs are configured to generate a voltage difference across the LED when the first and second CNTs are exposed to an electromagnetic (EM) field having a frequency within a predetermined range. The LED is configured to emit light when the voltage difference is greater than or equal to a threshold voltage.

20 Claims, 7 Drawing Sheets

(56) References Cited

U.S. PATENT DOCUMENTS

2012/0206042 A1* 8/2012 Yang .................... H05B 33/083
                                                    315/52
2013/0240847 A1* 9/2013 Zakhidov ............ H01L 27/3202
                                                    257/40

OTHER PUBLICATIONS

Colin Jeffrey; "Breakthrough Rectenna Converts Light Into DC Current"; http://www.gizmag.com/carbon-nanotube-rectenna-light-electricity-georg. . . ; Sep. 30, 2015; 5 pgs.

* cited by examiner

LIGHTING DEVICE AND SYSTEM AND METHOD FOR MAKING AND USING THE SAME

TECHNICAL FIELD

The present teachings relate to the field of lighting and, more particularly, to systems and methods for providing wireless lighting.

BACKGROUND

Aircraft typically include a plurality of lights on the interior thereof. For example, lights are provided on the ceiling and over the aisle to provide general lighting so that passengers may safely move about the aircraft. Additional lights are provided over the seats that provide lighting for reading. Lights are also provided on the floor or side walls (e.g., to identify exits). Currently, these lights require wires to supply power thereto. Wires increase the weight of the aircraft, which causes the aircraft to use more fuel during flights. In addition, wires may limit where the lights are placed on the aircraft or in any other area (e.g., a room in a building, the cabin or compartment of other types of vehicles, the outer surface of a structure, etc.).

SUMMARY

The following presents a simplified summary in order to provide a basic understanding of some aspects of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

A lighting device is disclosed. The lighting device includes a light-emitting diode (LED). A first carbon nanotube (CNT) is coupled to and extends from the LED. A second CNT is coupled to and extends from the LED. The first and second CNTs are configured to generate a voltage difference across the LED when the first and second CNTs are exposed to an electromagnetic (EM) field having a frequency within a predetermined range. The LED is configured to emit light when the voltage difference is greater than or equal to a threshold voltage.

A lighting system is also disclosed. The lighting system includes a first electromagnetic (EM) source and a first lighting device. The first EM source is configured to generate an EM field having a frequency within a first predetermined range. The first lighting device includes a light-emitting diode (LED), a first carbon nanotube (CNT), and a second CNT. The first CNT is coupled to and extends from the LED. The second CNT is coupled to and extends from the LED. The first and second CNTs are configured to generate a voltage difference across the LED when the first and second CNTs are exposed to the EM field having the frequency within the first predetermined range. The LED is configured to emit light when the voltage difference is greater than or equal to a threshold voltage.

A method for making a lighting device is also disclosed. The method includes positioning a light-emitting diode (LED) layer on a first carbon nanotube (CNT) layer. The LED layer includes a plurality of LEDs. The method also includes positioning a second CNT layer on the LED layer such that the LED layer is positioned between the first CNT layer and the second CNT layer. The method also includes simultaneously forming a plurality of CNTs on the first CNT layer and on the second CNT layer within a chamber of a reactor.

A method for installing a lighting device is also disclosed. The lighting device includes a light-emitting diode (LED), a first carbon nanotube (CNT) coupled to and extending from the LED, and a second CNT coupled to and extending from the LED. The first and second CNTs are configured to generate a voltage difference across the LED when the first and second CNTs are exposed to a first EM field having a frequency within a first predetermined range. The LED is configured to emit light when the voltage difference is greater than or equal to a threshold voltage. The method includes applying a substrate to a surface. The lighting device is coupled to the substrate.

The features, functions, and advantages that have been discussed can be achieved independently in various implementations or may be combined in yet other implementations further details of which can be seen with reference to the following description and drawings.

BRIEF DESCRIPTION OF THE DRAWINGS

The accompanying drawings, which are incorporated in and constitute a part of this specification, illustrate the present teachings and together with the description, serve to explain the principles of the disclosure. In the figures.

It should be noted that some details of the Figures have been simplified and are drawn to facilitate understanding of the present teachings rather than to maintain strict structural accuracy, detail, and scale.

DETAILED DESCRIPTION

Reference will now be made in detail to examples of the present teachings, which are illustrated in the accompanying drawings. Wherever possible, the same reference numbers will be used throughout the drawings to refer to the same or like parts.

Figure 1:
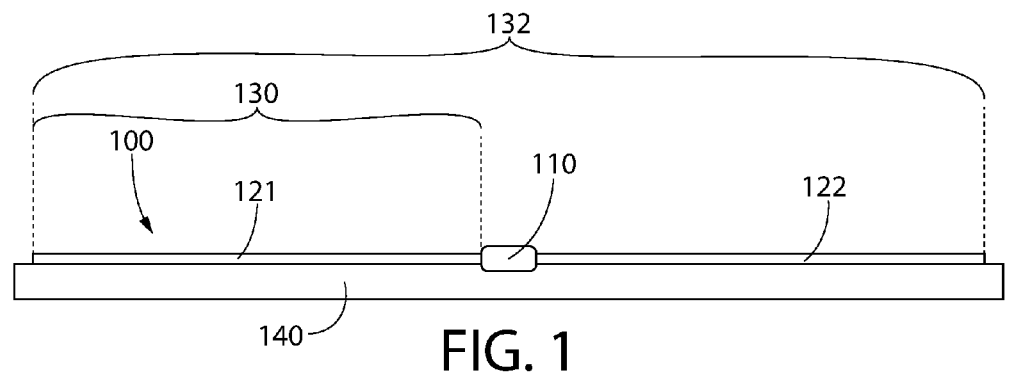
FIG. 1 depicts a schematic side view of a lighting device.

The embodiments described herein provide an improved system and method for providing lighting. For example, FIG. 1 depicts a schematic side view of a lighting device 100. The lighting device 100 includes a light-emitting diode ("LED") 110 and at least two carbon nanotubes ("CNTs") 121, 122. The LED 110 is a semiconductor light source having the first CNT 121 and the second CNT 122 coupled to and extending from opposing sides thereof. More particularly, the LED 110 is a p-n junction diode with the first CNT 121 coupled to the "p" portion of the p-n junction and the second CNT 122 coupled to the "n" portion of the p-n junction. The LED 110 emits light when a voltage difference across the p-n junction is greater than or equal to a predetermined amount (i.e., the threshold voltage of the diode).

The CNTs 121, 122 are allotropes of carbon with a substantially cylindrical nanostructure. The CNTs 121, 122 each have a length 130 ranging from about 10 micrometers (μm) to about 1000 μm. As such, a total length 132 of the lighting device 100 is from about 20 μm to about 2000 μm. The lengths 130 of the CNTs 121, 122 determine the frequency that activates the LED 110 (i.e., causes the LED 110 to emit light), as explained in greater detail below. The CNTs 121, 122 may have the same length or different lengths. The CNTs 121, 122 each have a cross-sectional width (e.g., diameter) ranging from about 0.3 nanometers (nm) to about 4 nm, or about 0.6 nm to about 1.1 nm because the method 500 (introduced below) for forming/growing CNTs tends to produce CNTs 121, 122 having the cross-sectional width within this range.

In at least one embodiment, the lighting device 100 may be connected within a circuit (e.g., a closed circuit). More particularly, the first CNT 121 may be connected to a first cable or wire in the circuit, and the second CNT 122 may be connected to a second cable or wire in the circuit. When the circuit is activated, a current flows through the first CNT 121, through the LED 110, and then through the second CNT 122, thereby applying a voltage difference across the LED 110. As mentioned above, when the voltage difference is greater than or equal to the threshold voltage of the LED 110, the LED 110 emits light.

In another embodiment, the lighting device 100 may be activated (i.e., the LED 110 emits light) wirelessly. In other words, the lighting device 100 may be activated without the lighting device 100 being coupled to a closed circuit. Rather, an electromagnetic (EM) field is transmitted through air. In the wireless embodiment, the first and second CNTs 121, 122 generate a voltage difference across the LED 110 when the first and second CNTs 121, 122 are exposed to an EM field having a frequency within a predetermined range. Thus, the CNTs 121, 122 act as an antenna. The LED 110 emits light when the voltage difference is greater than or equal to the threshold voltage.

Exposure to the EM field enables the lighting device 100 to emit light without the need for electrical wiring. Eliminating the electrical wiring reduces the weight of the lighting system, reduces the installation time, and reduces costs. The lighting device 100 may be installed in or on a substrate 140 and tested prior to assembly (e.g., in an aircraft cabin). The lighting device 100 may also be used for emergency lighting.

The LED 110 emits light when the EM field to which the lighting device 100 is exposed has a wavelength within a predetermined range. The LED 110 does not emit light when the lighting device 100 is exposed to wavelengths outside the predetermined range. More particularly, the wavelength of the EM field is the physical distance from peak to peak. To generate the voltage differential across the LED 110 that causes the LED 110 to emit light, one end of the lighting device 100 should be at the peak of the EM field, and the other end of the lighting device 100 should be at the trough. Thus, the total length 132 of the lighting device 100 is about 50% of the wavelength of the EM field when the lighting device 100 is aligned with the orientation of the EM field. If, for example, the lighting device 100 is rotated 45° with respect to the EM field, the total length 132 of the lighting device 100 should be about 70% (e.g., sqrt(2)*50%) of the wavelength of the EM field. Thus, the total length 132 of the device 100 is about 30% to about 70% or from about 40% to about 60%, such as about 50%, of the wavelengths of the waves in the EM field, depending upon the orientation of the lighting devices 100.

The wavelengths of the EM field may be in the infrared ("IR") or ultraviolet ("UV") portion of the spectrum; however, other wavelengths are contemplated herein. The waves in the EM field have a length from about 10 nm to about 100 nm, about 100 nm to about 1 μm, about 1 μm to about 10 μm, or about 10 μm to about 100 μm because these ranges do not interfere with communication channels and do not have adverse biological impacts on the human body.

Figure 2:
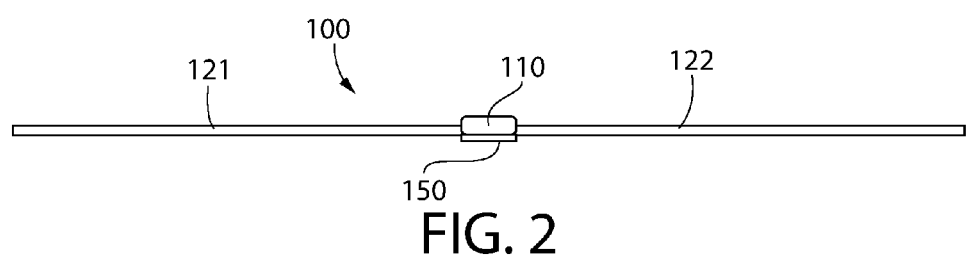
FIG. 2 depicts a schematic side view of the lighting device including a resistor.

FIG. 2 depicts a schematic side view of the lighting device 100 including a resistor 150. The resistor 150 is positioned between the first and second CNTs 121, 122. The resistor 150 is positioned in parallel with the p-n junction of the LED 110. The resistor 150 is coupled to and/or axially-aligned with the LED 110. The resistor 150 allows current to return on the reverse part of the cycle.

The resistor 150 has resistance from about 5 ohms to about 5 mega-ohms. The resistance is selected from within this range to allow the LED 100 to emit light while preventing charge buildup, as described in greater detail below. When the voltage across the LED 110 and the resistor 150 is greater than the threshold voltage of the LED 110, the resistance across the resistor 150 is greater than the resistance across the LED 110. The threshold voltage for the LED 110 is known to be about 0.3 V to about 0.7 V. As a result, the current flows through the LED 110 in a first direction, generating light. When the voltage across the LED 110 and the resistor 150 is less than the threshold voltage of the LED 110, the resistance across the LED 110 is greater than the resistance across the resistor 150. As a result, the current flows through the resistor 150, even during the period when the voltage difference is negative, relative to the direction of the LED's threshold voltage. Given that the voltage across the LED 110 is alternating positive-to-negative, the resistor 150 creates a return current path. The return path prevents the charge buildup that would occur without the return path that would prevent continuous operation.

Figure 3A:
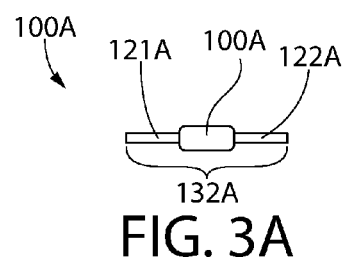
FIGS. 3A-3C depict schematic side views of three of the lighting devices shown in FIGS. 1 and 2 where each lighting device has a different length.
Figure 3B:
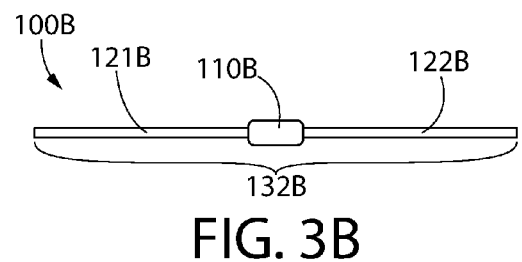
Figure 3C:
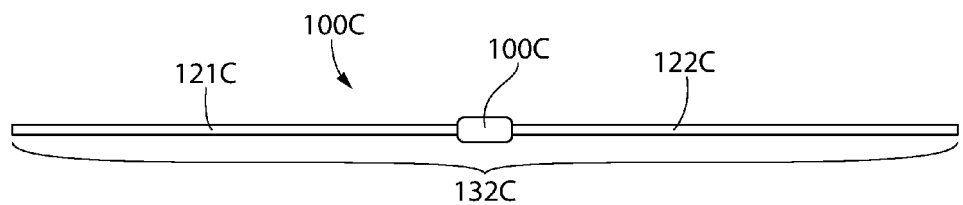

FIGS. 3A-3C depict schematic side views of three lighting devices 100A, 100B, 100C having different lengths. A first lighting device 100A has a first total length 132A and a first color when activated (e.g., red), a second lighting device 100B has a second total length 132B and a second color when activated (e.g., green), a third lighting device 100C has a third total length 132C and a third color when activated (e.g., blue), and so on when there are more than three different lighting devices. For example, the first lighting device 100A has a total length 132A ranging from about 10 μm to about 30 μm (e.g., 20 μm), the second lighting device 100B has a total length 132B ranging from about 40 μm to about 80 μm (e.g., 60 μm), and the third lighting device 100C has a total length 132C ranging from about 320 μm to about 400 μm (e.g., 360 μm). The LEDs 110A-C may have the same length and same threshold voltage in each of the lighting devices 100A-C, and the CNTs 121A-C, 122A-C have different lengths in each of the three embodiments. Accordingly, the different lengths of the CNTs 121A and 122A, CNTs 121B and 122B, and CNTs 121C and 122C cause the total lengths 132A, 132B, and 132C to be different from each other.

The first, second, and third lighting devices 100A-C are activated by different frequencies in the EM field due to the different lengths of the CNTs 121A and 122A, CNTs 121B and 122B, and CNTs 121C and 122C of the lighting devices 100A-C. For example, the length of the first and second CNTs 121A, 122A of the first lighting device 100A causes the voltage difference across the first LED 110A to be greater than or equal to the threshold voltage when the first lighting device 100A is exposed to the EM field having a frequency within a first predetermined range. The lengths of the CNTs 121B, 122B, 121C, 122C of the second and third lighting devices 100B, 100C prevent the voltage difference across the second and third LEDs 110B, 110C from being greater than or equal to the threshold voltage when the second and third lighting devices 100B, 100C are exposed to the EM field having the frequency within the first predetermined range. However, the lengths of the third CNT 121B and the fourth CNT 122B of the second lighting device 100B cause the voltage difference across the second LED 110B to be greater than or equal to the threshold voltage when the second lighting device 100B is exposed to the EM field having the frequency within a second predetermined range.

In one embodiment, the first, second, and third lighting devices 100A-C are activated by a single EM source that varies the frequency of the EM field. When the single EM source is used, only one type of the lighting device 100A, 100B, or 100C is activated at a time. Accordingly, different color light can be sequentially emitted by the lighting devices 100A-C. In another embodiment, the first, second, and third lighting devices 100A-C are activated by separate EM sources (e.g., three separate EM sources). The use of separate EM sources allows any combination of the first, second, and third lighting devices 100A-C to be activated at the same time. Accordingly, at least two different colors of light can be emitted simultaneously or in sequence.

Figure 4:
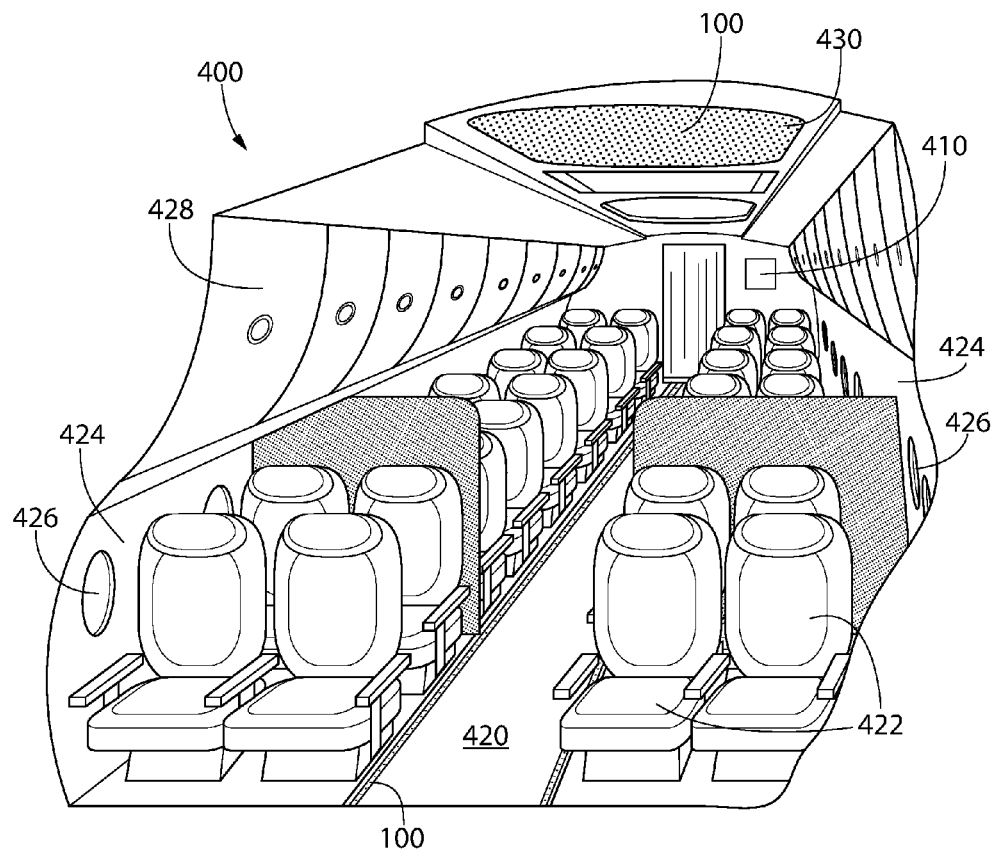
FIG. 4 depicts a perspective view of an interior of an aircraft including an electromagnetic source and the lighting devices of FIGS. 1-3C.

FIG. 4 depicts a perspective view of an interior of an aircraft 400 including an electromagnetic ("EM") source 410 and a plurality of the lighting devices 100 shown in FIGS. 1-3C. The aircraft 400 may be an airplane, a helicopter, an unmanned aerial vehicle ("UAV"), or the like. However, as will be appreciated, the lighting devices 100 are not limited to being located within an aircraft 400 and may be located in or on other objects where lighting is desired such as trains, cars, spray paint, brush-on-paint, buildings (commercial and residential), food, beverages, etc.

The EM source 410 may be an IR or UV diode light, a fluorescent light, a traveling waveguide tube, or the like. The EM source 410 may be positioned at the aft of the aircraft 400, as shown. In other embodiments, the EM source 410 may be positioned at the front of the aircraft 400, in one of the overhead bins 428, or at any suitable location within the aircraft 400. In some embodiments, the aircraft 400 includes two or more EM sources 410 (e.g., one at the front of the aircraft 400 and one at the aft of the aircraft 400). The EM source 410 may be powered by the engine or auxiliary power unit of the aircraft 400 and/or by power-converting circuitry that converts the power from the engine to usable frequencies and voltages. In other embodiments, the EM source 410 may be powered by the central power grid, on-site energy storage, a generator, or other suitable power source (e.g., when the lighting devices 100 are in a building).

As shown, the aircraft 400 includes an aisle 420, a plurality of seats 422 on either side of the aisle 420, side walls 424, windows 426, overhead bins 428, and a ceiling 430. The lighting devices 100 are coupled to and/or positioned along the aisle 420, the side walls 424, the underside or other surface of the overhead bins 428, the ceiling 430, a partition, a panel (e.g., between the seats 422 and the bins 428), and/or any other suitable location. These are merely a few examples. As will be appreciated, the lighting devices 100 may be coupled to and/or positioned on other surfaces on the interior of the aircraft 400 as well.

In one example, the lighting devices 100 are positioned on the ceiling 430. The lighting devices 100 may be white and/or yellow to resemble stars in the night sky. Each lighting device 100 is activated and deactivated independent of the other lighting devices 100 on the aircraft 400.

In another example, the lighting devices 100 are coupled to and/or positioned on the underside of the overhead bins 428 or other panel to serve as overhead reading lights. The switch for activating and deactivating the overhead reading lights makes a shutter (or screen) transition between opaque and transparent. The lighting devices 100 are always activated, but the light is only visible when the switch causes the shutter to be transparent. In an alternative embodiment, the shutter (or screen) transitions between opaque or transparent depending on the broadcast frequency of the EM source 410. For example, when the shutter (or screen) is opaque to the broadcast frequency, no EM waves reach the lighting devices 100. As a result, the lighting devices 100 are not activated. When the shutter (or screen) is transparent to the broadcast frequency, the EM waves reach the lighting devices 100. As a result, the lighting devices 100 are activated. In another alternative embodiment, the lighting devices 100 are always activated, and the switch moves the lighting devices 100 into and out of a recess or pocket to allow or prevent the emitted light to be seen.

Figure 5:
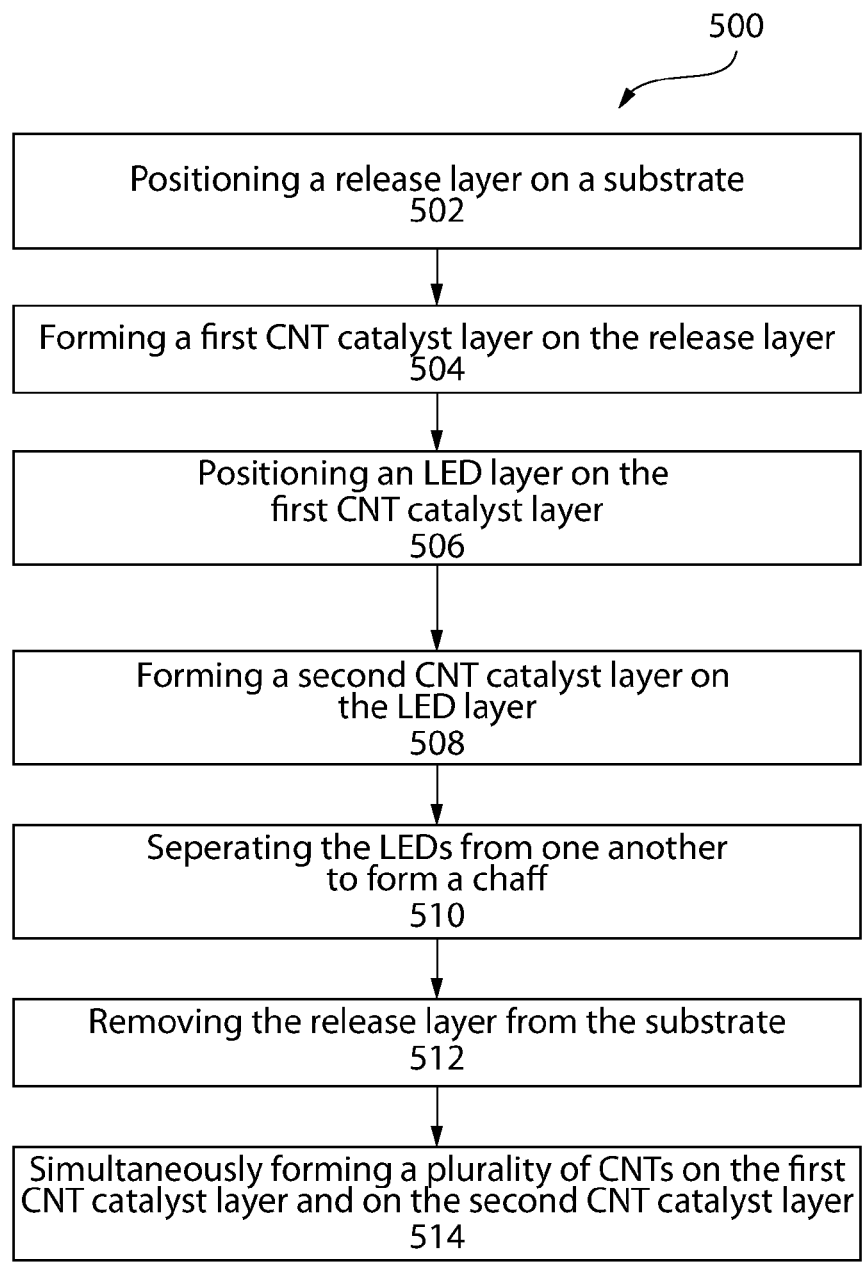
FIG. 5 depicts a flowchart of a method for making the lighting device shown in FIGS. 1-4.
Figure 6:
FIG. 6 depicts a cross-sectional side view of a release layer positioned on a substrate.

FIG. 5 depicts a flowchart of a method 500 for making the lighting device 100 shown in FIGS. 1 to 4. At least a portion of the method 500 is shown in FIGS. 6-11. The method 500 includes positioning a release layer 602 on a substrate 600 as at 502. FIG. 6 depicts a cross-sectional side view of the release layer 602 positioned on the substrate 100. The release layer 602 is a layer that can be dissolved, etched, softened, or removed selective to other layers. In one example, the release layer 602 is a photoresist layer such as SU-8 epoxy-based photoresist or an oxide layer or a nitride layer that is grown, deposited or otherwise formed on a surface of the substrate 600.

Figure 7:
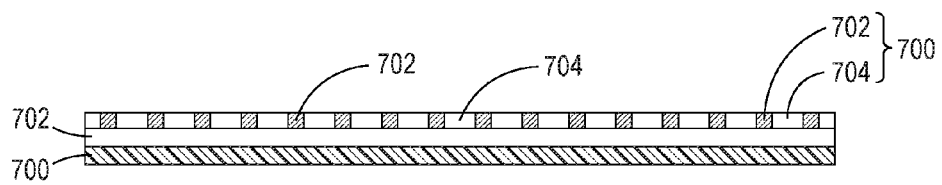
FIG. 7 depicts a cross-sectional side view of a first CNT catalyst layer on the release layer.

The method 500 also includes forming a first CNT catalyst layer 700 on the release layer 602 as at 504. FIG. 7 depicts a cross-sectional side view of the first CNT catalyst layer 700 on the release layer 602. The first CNT catalyst layer 700 includes a plurality of individual first CNT catalyst plugs 702, contacts, and/or interconnects (hereinafter, collectively, plugs) separated by an inert material 704. Each first CNT catalyst plug 702 is electrically-conductive (which includes electrically semi-conductive) to provide an electrically-functional part of a circuit, while the inert material 704 is an electrical dielectric that is not electrically-active during circuit operation. In one example, an optional blanket inert layer (not shown) is masked and etched to form a plurality of openings within the blanket inert layer. A damascene metal fabrication process or a chemical or physical deposition process (e.g., CVD, plasma enhanced CVD, atomic layer deposition, physical vapor deposition, etc.) is used to form the plurality of discrete first CNT catalyst plugs 702 in the openings formed within the blanket inert layer.

The inert material 704 is any dielectric material that resists the formation of a CNT material when exposed to a CNT-forming atmosphere or precursor. For example, the inert material 704 is a silicon oxide layer, a silicon nitride layer, or another suitable material. The first CNT catalyst plugs 702 include any electrically-conductive material that is suitable for catalyzing the formation of a CNT material when exposed to a CNT-forming atmosphere or precursor.

Figure 8:
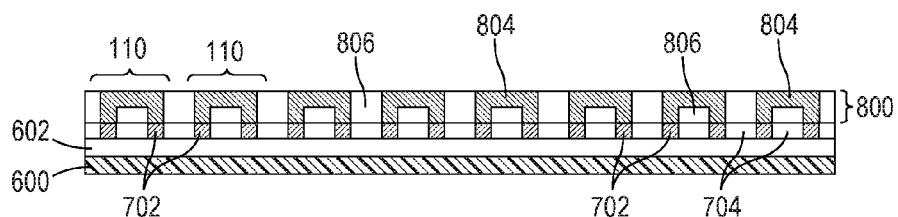
FIG. 8 depicts a cross-sectional side view of a LED layer positioned on the first CNT catalyst layer.

The method 500 also includes positioning a LED layer 800 on the first CNT catalyst layer 700 as at 506. FIG. 8 depicts a cross-sectional side view of the LED layer 800 positioned on the first CNT catalyst layer 700. The LED layer 800 includes a plurality of LEDs 110 (shown in FIGS. 1 to 3C). Each LED 110 in the LED layer 800 includes one or more electrically-conductive layers 804 that are at least partially conductive (e.g., one or more electrically conductive layers and/or one or more electrically semi-conductive layers) and one or more dielectric layers 806. Each LED 110 in the LED layer 800 may be formed to physically and/or electrically contact one or more of the first CNT catalyst plugs 702, such that at least one of the electrically-conductive layers 804 of each LED 110 is in electrical communication with one or more of the first CNT catalyst plugs 702 of the first CNT catalyst layer 700.

Figure 9:
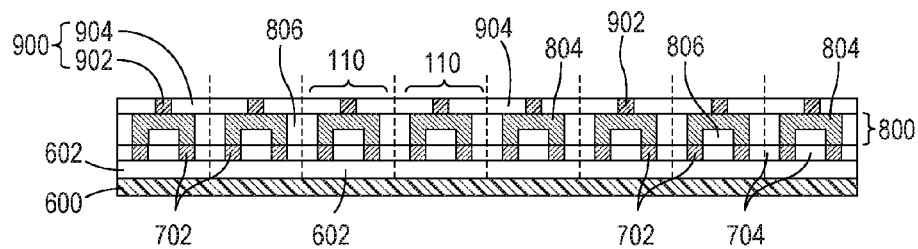
FIG. 9 depicts a cross-sectional side view of a second CNT catalyst layer positioned on the LED layer.

The method 500 includes forming and/or positioning a second CNT catalyst layer 900 on the LED layer 800 such that the LED layer 800 is positioned between the first CNT catalyst layer 700 and the second CNT catalyst layer 900, as at 508. FIG. 9 depicts a cross-sectional side view of the second CNT catalyst layer 900 formed on the LED layer 800 such that the LED layer 800 is positioned between the first CNT catalyst layer 700 and the second CNT catalyst layer 900. The second CNT catalyst layer 900 includes a plurality of individual second CNT catalyst plugs 902 separated by an inert material 904. Each second CNT catalyst plug 902 is electrically-conductive, while the inert material 904 is an electrical dielectric. In one example, each second CNT catalyst plug 902 is formed to physically and/or electrically contact one or more electrically-conductive layers 804 of each LED 110, such that at least one of the electrically-conductive layers 804 of each LED 110 is in electrical communication with one or more of the second CNT catalyst plugs 902 of the second CNT catalyst layer 900.

Figure 10:
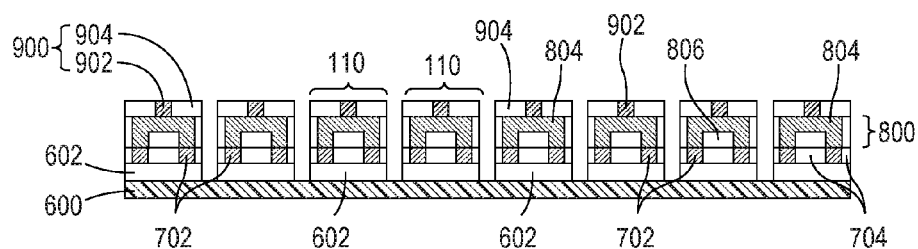
FIG. 10 depicts a cross-sectional side view of the LEDs separated from one another.

The method 500 includes separating a first LED of the plurality of LEDs 110 from a second LED of the plurality of LEDs 110 (e.g., prior to simultaneously forming a plurality of CNTs 121, 122 on the first CNT catalyst layer 700 and on the second CNT catalyst layer 900), as at 510. FIG. 10 depicts a cross-sectional side view of the LEDs 110 separated from one another. The first and second CNT catalyst layers 700, 900 are sectioned so that each LED 110 is positioned between a section of the first and second CNT catalyst layers 700, 900. The separating/sectioning is performed by dicing, etching, or other any other process that physically separates the electrical circuits 802 from one another. Dicing may be performed using, for example, a wafer dicing saw. Etching may be performed using, for example, an anisotropic or vertical dry etch.

Figure 11:
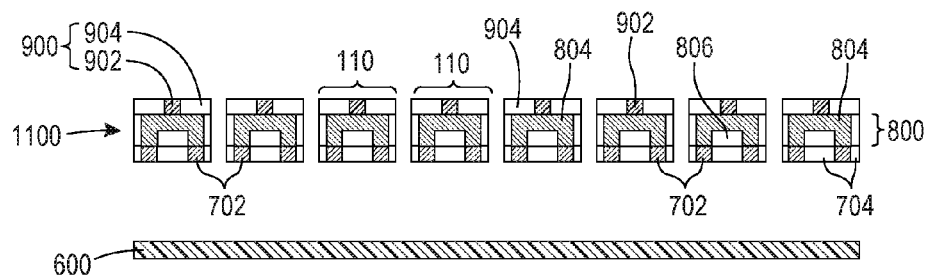
FIG. 11 depicts a cross-sectional side view of the release layer removed from the substrate so that a chaff is released from the substrate.

The plurality of sectioned LEDs 110 positioned between sections of the first and second CNT catalyst layers 700, 900 is referred to as a "chaff." The method 500 includes removing the release layer 602 from the substrate 600 so that the chaff 1100 is released from the substrate 600, as at 512. FIG. 11 depicts a cross-sectional side view of the release layer 602 removed from the substrate 600 so that the chaff 1100 is released from the substrate 600. Removing the release layer 602 also exposes the first CNT catalyst plugs 702 and the inert material 704 of the first CNT catalyst layer 700.

Figure 12:
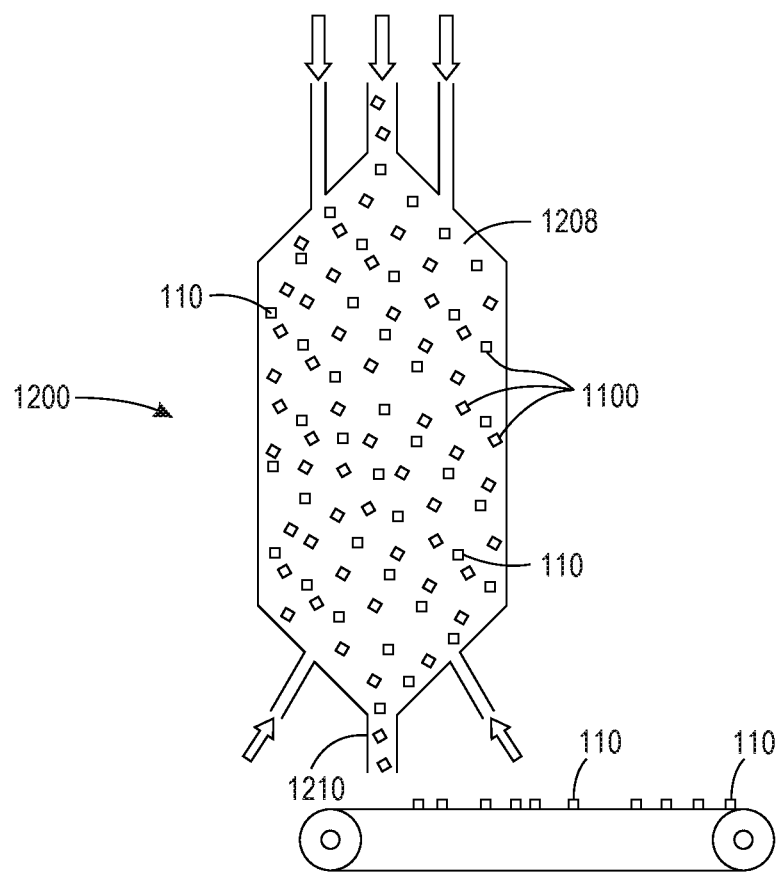
FIG. 12 depicts a schematic view of the chaff positioned within a reactor chamber.

The method 500 includes simultaneously forming a plurality of CNTs 121, 122 on the first CNT catalyst layer 700 and on the second CNT catalyst layer 900 within a chamber of a reactor, as at 514. More particularly, the CNTs 121, 122 are formed on the first plugs 702 of the first CNT catalyst layer 700 and on the second plugs 902 of the second CNT catalyst layer 900. Forming the plurality of CNTs 121, 122 is achieved by exposing the chaff 1100 to an environment that is conducive to the growth of CNTs 121, 122. In an example, the chaff 1100 is unsupported, free-floating, and suspended within a CNT-forming environment, such as a CVD reactor 1200, without physically contacting a surface of the reactor 1200, at least for a period of time, during the formation of the CNTs 121, 122. FIG. 12 depicts a schematic view of the chaff(s) 1100 positioned within a chamber 1208 of the reactor 1200. Both the first plugs 702 and the second plugs 902 are simultaneously exposed to the environment, and CNTs 121, 122 (shown in FIGS. 1 to 3C) simultaneously form on the first plugs 702 on a first major surface of the LEDs 110 and the second plugs 902 on a second major surface of the LEDS 110, where the first major surface is opposite the second major surface.

In an example, a LED 110 may be fed into the chamber 1208, where CNTs 121, 122 are simultaneously formed on the CNT catalyst plugs 702, 902. In another example, tens, hundreds, or thousands of LEDs 110 may be fed as chaff 1100 into the chamber 1208, where CNTs 121, 122 are simultaneously formed on the CNT catalyst plugs 702, 902. In another example, chaff 1100 may be fed continuously into the chamber 1208 during a continuous CNT formation process, although batch processing is also contemplated. After completion of CNT formation, one or more electrical circuits 802 may be ejected through a reactor or chaff exhaust port 1210, and then collected for subsequent processing.

Figure 13:
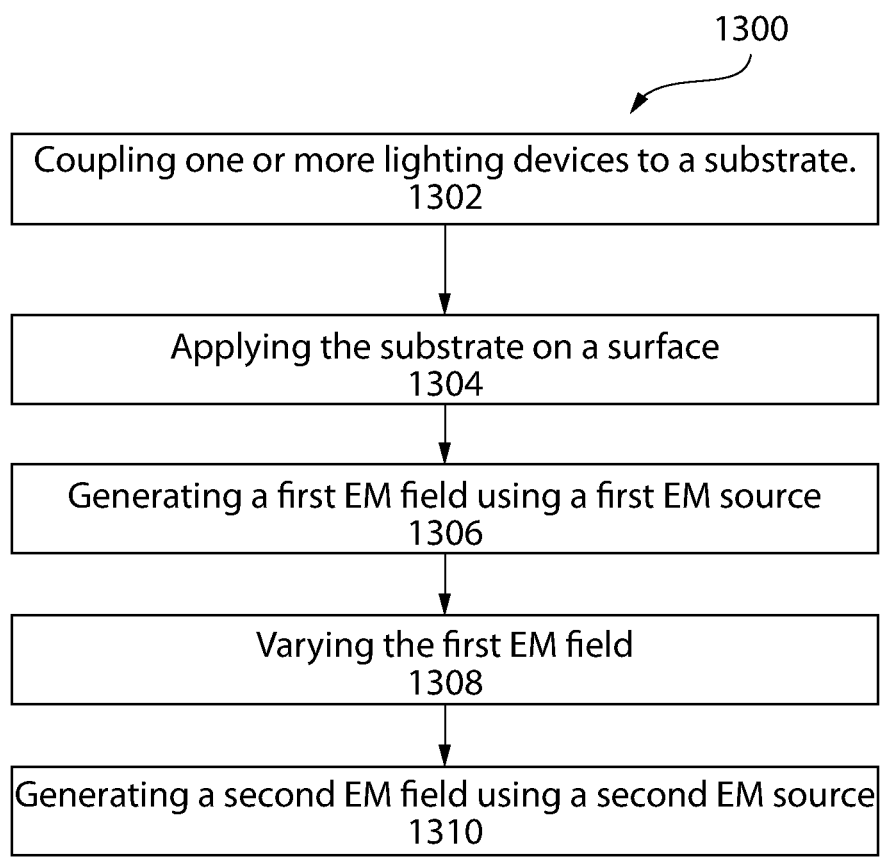
FIG. 13 depicts a flowchart of a method for generating light using the lighting device shown in FIGS. 1-4.

FIG. 13 depicts a flowchart of a method 1300 for generating light using the lighting device 100 (shown in FIGS. 1 to 3C). The method 1300 includes coupling the one or more lighting devices 100 to a substrate 140 (shown in FIG. 1), as at 1302. More particularly, the lighting devices 100 may be coupled to a surface of the substrate 140 or embedded (e.g., partially or fully encapsulated) within the substrate 140. The substrate 140 may be or include a transparent adhesive sticker, an appliqué, a liquid (e.g., a paint), or the like. When more than one lighting device 100 is used, the density of the lighting devices 100 in or on the substrate 140 directly affects the amount of light that is emitted. For example, the number of lighting devices 100 coupled to and/or positioned on a sticker or appliqué is increased, per unit of surface area, to increase the amount of light that is emitted. In another example, the number of lighting devices 100 positioned within a bucket or jar of paint is increased, per unit volume, to increase the amount of light that is emitted (e.g., after the paint is spread on a surface).

The method 1300 includes applying the substrate 140, with the lighting device(s) 100, on a surface, as at 1304. As mentioned above, the surface may be a surface within an interior of an aircraft 400; however, as mentioned above, other locations are also contemplated. For example, the surface may be or include the aisle 420, the side walls 424, surface of the overhead bins 428, the ceiling 430, any suitable panel, or a combination thereof. When the substrate 140 is a sticker or appliqué, the sticker or appliqué includes an adhesive layer that adheres the substrate 140 to the surface. When the substrate 140 is a liquid, the liquid is applied to the surface using a brush, roller, and/or spray. The lighting devices 100 may have any orientation with respect to the direction that the EM field is transmitted from the EM source 410 because scattering of the EMF field occurs throughout the interior of the aircraft 400. As a result, the EM waves travel in many directions.

The method 1300 may optionally include generating a first EM field using a first EM source 410, as at 1306. The first EM field is generated after the substrate 140, with the lighting devices 100, has been applied to the surface. The first EM field generated by the first EM source 410 does not need to have a uniform intensity (e.g., throughout the interior of the aircraft 400) to cause each of the lighting devices 100 to emit light of uniform intensity. In other words, a first of the lighting devices 100 positioned closer to the first EM source 410 will not emit light of a greater intensity than a second of the lighting devices 100 that is farther away from the first EM source 410. As long as the intensity of the first EM field is sufficient to produce the threshold voltage across the LEDs 110, the intensity of the light emitted from each LED 110 is substantially uniform and independent of the intensity of the first EM field.

The method 1300 may optionally include varying the (e.g., frequency of the) first EM field generated by the first EM source 410, as at 1308. For example, the aircraft 400 may include a first plurality of lighting devices 100A positioned at a first location (e.g., on the ceiling 430) and a second plurality of lighting devices 100B positioned at a second location (e.g., on the aisle 420). The frequency of the first EM field generated by the EM source 410 may be varied from a first frequency that causes the first plurality of lighting devices 100A to emit light to a second frequency that causes the second plurality of lighting devices 100B to emit light.

Instead of or in addition to varying the first EM field, the method 1300 may also include generating a second EM field using a second EM source, as at 1310. The first plurality of lighting devices 100A are controlled (i.e., activated and deactivated) using the first EM field, and the second plurality of lighting devices 100B are controlled using the second EM field. The second plurality of lighting devices 100B are unaffected by the first EM field, and the first plurality of lighting devices 100A are unaffected by the second EM field.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. It will be appreciated that structural components and/or processing stages can be added or existing structural components and/or processing stages can be removed or modified. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "about" indicates that the value listed may be somewhat altered, as long as the alteration does not result in nonconformance of the process or structure to the present teachings. The present disclosure provides specific implementations without being exhaustive, and other implementations of the present teachings may be apparent to those skilled in the art from consideration of the specification and practice of the disclosure herein. It is intended that the specification and examples be considered as exemplary only, with a true scope and spirit of the present teachings being indicated by the following claims.

The invention claimed is:

1. A lighting device comprising:
   a light-emitting diode (LED);
   a first carbon nanotube (CNT) coupled to and extending from the LED; and
   a second CNT coupled to and extending from the LED, wherein:
     the first and second CNTs are configured to generate a voltage difference across the LED when the first and second CNTs are exposed to an electromagnetic (EM) field having a frequency within a predetermined range,
     the EM field is generated by a diode light, a fluorescent light, a travelling waveguide tube, or a combination thereof,
     a length of the first CNT and a length of the second CNT are selected such that a total length of the lighting device is from about 30% to about 70% of a wavelength of the EM field when the frequency is within the predetermined range, and
     the LED is configured to emit light when the voltage difference is greater than or equal to a threshold voltage.

2. The lighting device of claim 1, wherein the lighting device is configured to be powered by an electromagnetic source.

3. The lighting device of claim 1, further comprising a resistor coupled to the first and second CNTs.

4. The lighting device of claim 3, wherein the resistor is coupled in parallel with the LED.

5. The lighting device of claim 3, wherein when the voltage difference across the LED and the resistor is greater than the threshold voltage, a resistance across the resistor is greater than a resistance across the LED, causing the LED to emit light.

6. A lighting system comprising:
   a first electromagnetic (EM) source configured to generate an EM field having a frequency within a first predetermined range, wherein the first EM source is powered by an engine, an auxiliary power unit, a central power grid, an on-site energy storage, or a generator; and
   a first lighting device comprising:
     a first light-emitting diode (LED);

a first carbon nanotube (CNT) coupled to and extending from the first LED; and a second CNT coupled to and extending from the first LED, wherein:

the first and second CNTs are configured to generate a voltage difference across the first LED when the first and second CNTs are exposed to the EM field having the frequency within the first predetermined range, a length of the first CNT and a length of the second CNT are selected such that a total length of the first lighting device is from about 30% to about 70% of a wavelength of the EM field when the frequency is within the first predetermined range, and the first LED is configured to emit light when the voltage difference is greater than or equal to a threshold voltage.

7. The lighting system of claim 6, further comprising a substrate, wherein the first lighting device is positioned in or on the substrate, and wherein the substrate comprises an adhesive sticker, an appliqué, or a paint.

8. The lighting system of claim 6, wherein the lighting system further comprises a second lighting device that comprises:

a second LED;

a third CNT coupled to and extending from the second LED; and a fourth CNT coupled to and extending from the second LED, wherein the third and fourth CNTs are configured to generate the voltage difference across the second LED when the third and fourth CNTs are exposed to the EM field having the frequency within a second predetermined range that is different from the first predetermined range, and wherein the second LED is configured to emit light when the voltage difference is greater than or equal to the threshold voltage.

9. The lighting system of claim 8, wherein a length of the first CNT of the first lighting device is different than a length of the third CNT of the second lighting device.

10. The lighting system of claim 9, wherein the length of the first CNT of the first lighting device is configured to cause the voltage difference across the first LED of the first lighting device to be greater than or equal to the threshold voltage when the first lighting device is exposed to the EM field having the frequency within the first predetermined range.

11. The lighting system of claim 9, wherein the length of the third CNT of the second lighting device is configured to prevent the voltage difference across the second LED of the second lighting device from being greater than or equal to the threshold voltage when the second lighting device is exposed to the EM field having the frequency within the first predetermined range.

12. The lighting system of claim 9, wherein the length of the third CNT of the second lighting device is configured to cause the voltage difference across the second LED of the second lighting device to be greater than or equal to the threshold voltage when the second lighting device is exposed to the EM field having the frequency within the second predetermined range.

13. The lighting system of claim 8, wherein the first EM source is configured to vary the frequency of the EM field between the first predetermined range and the second predetermined range.

14. The lighting system of claim 8, further comprising a second EM source configured to generate a second EM field having the frequency within the second predetermined range.

15. A method for installing a lighting device that includes a light-emitting diode (LED), a first carbon nanotube (CNT) coupled to and extending from the LED, and a second CNT coupled to and extending from the LED, wherein the first and second CNTs are configured to generate a voltage difference across the LED when the first and second CNTs are exposed to a first EM field having a frequency within a first predetermined range, wherein the first EM field is generated by a diode light, a fluorescent light, a travelling waveguide tube, or a combination thereof, and wherein the LED is configured to emit light when the voltage difference is greater than or equal to a threshold voltage, the method comprising:

applying a substrate to a surface, wherein the substrate comprises the lighting device coupled to the substrate.

16. The lighting system of claim 6, wherein the EM field is generated by a diode light, a fluorescent light, a travelling waveguide tube, or a combination thereof.

17. The lighting device of claim 1, wherein an EM source that generates the EM field is powered by an engine, an auxiliary power unit, a central power grid, an on-site energy storage, or a generator.

18. The lighting system of claim 6, wherein the first EM source is positioned on an aircraft.

19. The lighting system of claim 6, further comprising a substrate, wherein the first lighting device is positioned in or on the substrate, and wherein the substrate comprises a liquid.

20. The lighting system of claim 6, further comprising a screen that transitions between a first state and a second state, wherein light from the first LED is visible through the screen when the screen is in the first state, and wherein light from the first LED is not visible through the screen when the screen is in the second state.

* * * * *